United States Patent [19]

George

[11] Patent Number: 5,497,094
[45] Date of Patent: Mar. 5, 1996

[54] ELECTRICAL CIRCUIT IDENTIFICATION MEANS

[76] Inventor: David L. George, 12 Andras Rd., Sandy Hook, Conn. 06482

[21] Appl. No.: 184,602

[22] Filed: Jan. 21, 1994

[51] Int. Cl.[6] .......................... G01R 31/28; G01R 19/00
[52] U.S. Cl. ................ 324/529; 324/66; 340/654
[58] Field of Search ................ 324/66, 67, 529, 324/522, 539, 255; 340/654, 638

[56] References Cited

U.S. PATENT DOCUMENTS

| | | | |
|---|---|---|---|
| 3,076,931 | 2/1963 | Jasper | 324/66 |
| 3,175,047 | 3/1965 | Borberg | 340/654 |
| 3,531,790 | 9/1970 | Staley | 340/654 |
| 3,623,142 | 11/1971 | Key | 324/66 |
| 3,628,138 | 12/1971 | Collier | 324/66 |
| 3,805,155 | 4/1974 | Tsuda et al. | 324/133 |
| 3,891,811 | 6/1975 | Miller | 179/175.3 A |
| 3,924,179 | 12/1975 | Dozier | 324/66 |
| 4,121,152 | 10/1978 | Hale et al. | 324/66 |
| 4,129,825 | 12/1978 | Brinegar | 324/52 |
| 4,556,839 | 12/1985 | George | 324/66 |
| 4,734,638 | 3/1988 | Weber | 324/66 |
| 4,801,868 | 1/1989 | Brooks | 324/66 |
| 4,906,938 | 3/1990 | Konopka | 324/529 |
| 5,315,255 | 5/1994 | Bettinger | 324/72 |

FOREIGN PATENT DOCUMENTS

| | | |
|---|---|---|
| 804773 | 1/1969 | Canada . |
| 2566539 | 12/1985 | France . |
| 1162811 | 8/1969 | United Kingdom . |

OTHER PUBLICATIONS

Greenlee Textron, Model 2007, Power Finder Circuit Tracer, Instruction and Safety Manual, 1982, 8 pages.

*Primary Examiner*—Maura K. Regan
*Attorney, Agent, or Firm*—H. Gibner Lehmann; K. Gibner Lehmann

[57] ABSTRACT

A hand-held electronic receiver for detecting pulses of high magnitude and short duration in an electrical circuit, including an inductive pick-up coil, an electrical signaller, an electrical power supply for the signaller, and an electronic trigger responsive to electrical pulses induced in the pick-up coil for effecting energization of the signaller from the power supply. There is a manually-adjustable control including a circuit responsive to pulsed energy, bridging the pick-up coil for bleeding off portions of induced pulses from the coil, thereby to enable a selective control of resultant output from the coil to be had.

8 Claims, 3 Drawing Sheets

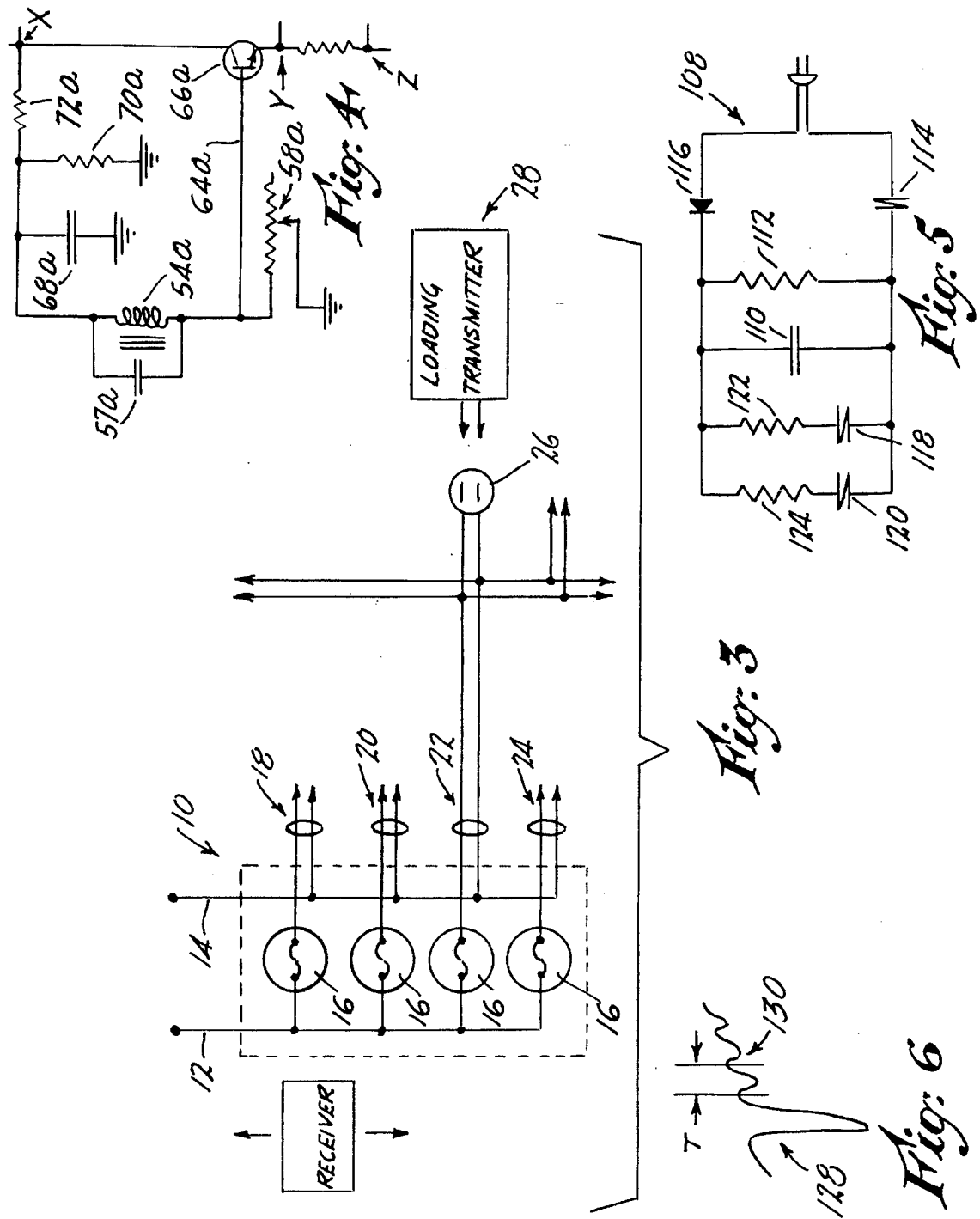

1

ELECTRICAL CIRCUIT IDENTIFICATION MEANS

NO CROSS REFERENCES TO RELATED APPLICATIONS

STATEMENT AS TO RIGHTS TO INVENTIONS MADE UNDER FEDERALLY-SPONSORED RESEARCH AND DEVELOPMENT

Research and development of the present invention and application have not been Federally-sponsored, and no rights are given under any Federal program.

This invention relates to improvements in the circuit tracer devices disclosed in my U.S. Pat. No. 4,556,839 granted Dec. 3, 1985, and entitled ELECTRICAL CIRCUIT IDENTIFICATION MEANS.

It is respectfully requested that the entire disclosure of U.S. Pat. No. 4,556,839 be incorporated into the present application, by specific reference.

BACKGROUND OF THE INVENTION

FIELD OF THE INVENTION

The invention generally involves circuit tracer devices, and more particularly devices of the type which apply a momentary electrical load on a specific line and which utilize a hand-held receiver responsive to specific unique characteristics of such a load current in order to locate an adjoining line or lines which are carrying the load current having the unique characteristics.

DESCRIPTION OF THE RELATED ART INCLUDING INFORMATION DISCLOSED UNDER 37 CFR §§1.97–1.99

A number of prior devices have been proposed and produced, to enable individual circuits in an electrical network to be located or identified. Patents illustrating several systems include U.S. Pat. Nos. 3,076,931; 3,623,142; and 3,924,179, all of which disclose circuit locaters that are relatively complex, and expensive to manufacture and assemble.

In particular, with the device of U.S. Pat. No. 3,076,931, the remote ends of a cable being monitored are connected together, and a pulse generator and rotary switch are employed to create different pulses in different lines, which are then discriminated by an inductive pick-up coil so as to identify the desired leads. This arrangement presupposes that the lines in question are not already energized, but instead are safe to be worked on and connections made, and that no existing energy of the lines is to be used to generate or effect the pulses.

U.S. Pat. No. 3,623,142 discloses a motor-operated cam that actuates a switch for applying power, through a lamp, to a test lead that is intended to be connected to the electrical lines being tested, one at a time. The remote ends of the lines must be grounded so that a pulse can be generated by the switch as it is operated by the cam. Thus, the lines cannot be energized conventionally and tested while carrying power, but instead special "dead" conditions must be established before the testing can commence.

U.S. Pat. No. 3,924,179 illustrates the use of a jumper across the remote ends of a conductor pair, while a pulse is applied to the near end and detected by a clip-on meter. Here, again, the testing cannot be done while the lines are carrying the usual energization, but instead the lines must first be disconnected from all the conventional energy sources prior to the testing.

It has also been proposed to apply a modulated Gaussian noise signal to a line, such as a telephone line, whereby there can be carried out testing that is inaudible to persons communicating over the line, because the waveforms can only be detected by special receiving equipment.

U.S. Pat. No. 4,121,152 discloses a circuit tracer employing an electrically pulsed load that is applied to a live power receptacle in the circuit to be located, and a detector such as a clip-on ammeter for detecting which of several unknown leads is carrying the current produced by the load. Included as loads are an incandescent lamp or an electrical heater.

U.S. Pat. No. 4,906,938 discloses a circuit locater utilizing a plug-in transmitter having a solid state device known as a Sidac connected in series with a diode and a parallel RC network. A receiver (36) is provided, utilizing a pick-up coil which is connected as part of a broadly-tuned circuit, and the output from the pickup coil is fed to an amplification stage that includes a transistor, col. 3, line 60. The output of the amplification stages drives an integrated circuit type "555" timer, which in turn operates a buzzer and illuminates an LED when the signal from the coil is of a predetermined magnitude. A sensitivity control comprising resistor (62) sets the sensitivity of the amplification stage that includes the transistor (54).

British Pat. No. 1,162,811 discloses a circuit locater employing a transmitter powered by an A. C. line, the transmitter having a capacitor and thyristor (19) connected across the line, and a scaler (15) and phase controller (16) for feeding the gate of the thyristor at predetermined, desired time intervals. A receiver includes a pickup coil (20) or tuned detector (160, FIGS. 11, 13) that respond to pulses generated in the line by the transmitter. The receiver includes an amplifier (162) which is sensitive to high-frequency pulses. The amplifier has three transistor stages, and low frequency feedback between the first two stages.

French Pat. No. 2 566 539 discloses a circuit locater employing a transmitter connected across a line to be tested, and having a low value resistor (4) in series with a thyristor (5). The latter is in turn controlled by a timer, to generate high intensity pulses of current over one half cycle, at spaced intervals of one second, to enable the line to be located at a remote point thereon.

Canadian Pat. No. 804,773 discloses a modular appliance tester having an input circuit for connection to powered mains, and an output circuit into which an appliance to be tested can be plugged. An internal bimetal is employed to flash an indicator light if the appliance is diagnosed as being "faulty". The light glows steadily if a nominal current is drawn by the appliance, implying that it is operating in its intended manner.

Other circuit locaters are illustrated and described in publications issued by Greenlee Textron, "Instruction and Safety Manual", Greenlee 2007 Power Finder Circuit Tracer, 1992, Greenlee Textron, Inc., Rockford, Ill. (7 sheets total); and Etcon Corporation, "ETCON . . . EXPECT MORE, CP115 Circuit Pup Circuit Tracer", Etcon Corporation, Burr Ridge, Ill., no date (cols. 2, 3, 4, 5, 6, 7, 8, 9, 10 and 11). In both of these devices, a load is applied to a line in question, the load drawing short bursts of current and creating a "signature" magnetic field, which is sensed by a remotely located receiver that is especially designed to respond only to magnetic fields around conductors that exhibit the corresponding "signature". In the Greenlee device, a total of four crystal-derived, separate frequencies is employed to produce a unique load waveform, and the receiver responds only to this unique combination of frequencies, constituting the special "signature".

While several of the above identified arrangements have met with some commercial success, the relatively complex nature of the disclosed devices has entailed relatively high manufacturing costs and correspondingly high selling prices, often making the devices too expensive for the average homeowner, or even for the small businessman running essentially a "single man" operation, operating on low profit margins.

Thus there has existed a need for an especially simple device which could be manufactured at extremely low cost, e.g. well below $ 10.00, and which could still provide the desired reliability and performance needed in order to effectively isolate individual lines in homes, office buildings, laboratories, warehouses, and other facilities.

In addition, with products that employed an electrical load to be installed across a power circuit to be tested, care had to be exercised to insure that the voltage appearing on such a circuit was below a particular level, failing which, potential damage to the load could result. Reference is made to the Greenlee Power Finder brochure above identified, wherein there is stated, "The transmitter is designed to plug into a standard 120 V outlet. For all other uses, a transmitter plug adapter, with alligator clips and attachable receptacle blades are included.". In other words, operation of the "transmitter" by itself was limited, and could not directly accommodate 220 or 440 volt lines, commonly found in industrial complexes, without special adaptors.

In the case of the ETCON unit, operation was limited to the range 24–300 volts AC, as noted in col. 6 of the ETCON brochure above identified.

SUMMARY OF THE INVENTION

The above disadvantages and drawbacks of prior circuit locaters are largely obviated by the present invention which has for one object the provision of an improved electrical circuit identification means, operable with multiple branch circuits leading from an energy distribution network or point to different remote locations in a facility, whereby a single predetermined circuit can be reliably identified and de-energized without de-energizing the entire system and without requiring more than a single person or worker to carry out such function, thereby to enable such branch to be disconnected or rendered "dead", as by pulling of its fuse or switching of its circuit breaker.

Another object of the invention is to provide an improved circuit identification means as above, which is especially simple and inexpensive in its construction.

Still another object of the invention is to provide an improved circuit identification means in accordance with the foregoing, which is reliable in its operation and is of sturdy construction whereby it can withstand considerable usage and rough handling without malfunctioning.

Yet another object of the invention is to provide an improved circuit identification means as set forth above, which can be utilized by relatively unskilled personnel, and with accurate and precise results.

A still further object of the invention is to provide an improved circuit identification means as above characterized, which is especially small and compact, and light in weight.

Still another object of the invention is to provide an improved circuit identification means as above outlined, in which the transmitter part is substantially completely powered by the circuits being tested, and which is intended to be employed on circuits in which are in their normal, "live", operative state or condition.

The above objects are accomplished by a hand-held electronic means for inductively detecting low frequency pulses of high magnitude and short duration in an electrical circuit, comprising in combination an inductive pick-up coil and a magnetic core therefor, electrical signalling means, electrical power means adapted to electrically energize the signalling means, an electronic trigger means responsive to electrical pulses induced in the pick-up coil for effecting energization of the signalling means from the power means, and a manually-adjustable control means comprising a circuit responsive to pulsed energy, bridging the pick-up coil for bleeding off portions of induced pulses from the coil, thereby to enable a selective control of the operation of the trigger means to be had.

The arrangement is such that a portion of the induced voltage in the pick-up coil is selectively bled off by a variable resistor, thereby reducing the level of voltage from the coil that is fed to the trigger means. It has been determined experimentally that the response of the trigger means in this manner is significantly improved as compared to that of many of the prior art devices, in that there is realized greater ease in use and enhanced reliability in locating and isolating the desired electrical circuit.

Other features and advantages will hereinafter appear.

BRIEF DESCRIPTION OF THE DRAWINGS

FIG. 3 is a schematic circuit diagram of an electrical supply facility employing a fused or breaker-protected panel, input lines and output lines, the facility being typical of the kind with which the present invention is used.

FIG. 4 is a fragmentary schematic of a circuit constituting another embodiment of the invention, having terminals labelled X, Y and Z, which circuit is adapted to be substituted for circuitry having similarly labelled terminals in the diagram of FIG. 2.

FIG. 5 is a schematic circuit diagram of an improved transmitter for use with a multiplicity of different line voltages.

FIG. 6 is a fragmentary representation of the waveform of the voltage pulse as produced by the transmitter of FIG. 1.

DESCRIPTION OF THE PREFERRED EMBODIMENTS

Referring first to FIG. 3 there is illustrated a simplified wiring diagram of a portion of a fuse panel 10 of a type conventionally employed in dwellings, offices, factories and the like where one side of the circuitry is grounded as universally required by building codes. In the illustration it will be seen that fuses are employed; however, the principles set forth below are also applicable for use with circuit breaker type panels, as can be readily understood. The input lines are indicated 12 and 14, and the fuses 16, respectively. Output lines 18, 20, 22 and 24 supply various parts of the building or dwelling. A remotely located electrical receptacle is shown at 26, and for purposes of explanation it will be assumed that a worker desires to determine which of the fuses 16 is associated with this particular receptacle 26.

Figure 1:
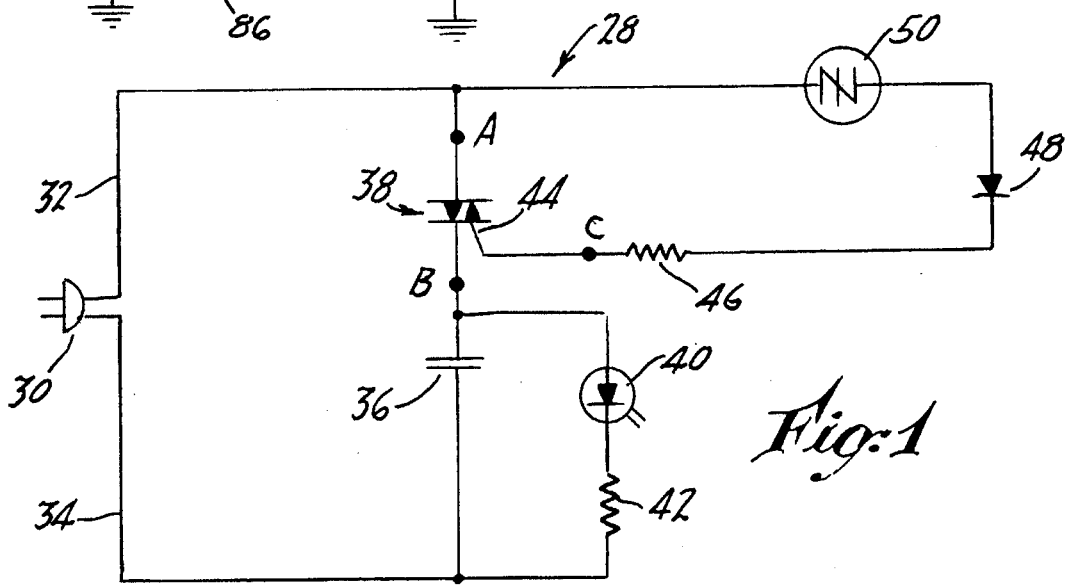
FIG. 1 is a schematic circuit diagram of a transmitter adapted to be powered by an A. C. line, for superimposing on said line, a series of short-duration, high intensity pulses which are capable of being detected at other, remote points on the line.

A transmitter 28 of the active type adapted to be directly plugged into the receptacle 26 is shown in FIG. 1. The connector plug 30 has lead wires 32 and 34, which may be considered the "hot" and "neutral" leads of the transmitter, receivable respectively in the receptacle 26.

Connected across the leads 32 and 34 is a passive load circuit which comprises a load capacitor 36 and an electronic switch 38, in this case a triac. Across the capacitor 36 is a light-emitting diode 40 and bleeder or limiting resistor 42 both of which may be considered as part of the passive load portion of the transmitter. The transmitter 28 has an active circuit portion which comprises the gate 44 of the triac 38, said gate being connected in series with a current-limiting resistor 46; a diode 48, and a solid state device 50 known in the trade as a Sidac. The Sidac 50 has the characteristic that it constitutes an open circuit until a predetermined, rated threshhold voltage is applied across its terminals, upon which it is rendered conductive and remains so until the current flowing through it is reduced to a minimum threshhold value, at which time the Sidac is rendered non-conductive.

The arrangement disclosed in FIG. 1 is considered to be an active load device because the activation of the triac 38 is effected by the operation of the Sidac 50, diode 48 and resistor 46 gating the triac 38. The passive load circuit portion comprising the triac 38 and capacitor 36 is activated by virtue of the triac 38 being periodically gated into conduction on spaced apart cycles of the A. C. wave, typically at one-half second or one second intervals, during which the (largely uncharged) capacitor 36 is placed directly across the line, effectively presenting a momentary "short-circuit", until the capacitor charges. This momentary "short-circuit" produces a large intensity, instantaneous or short-duration current pulse on the line, which can be typically tens of amperes, the voltage of which is represented by the waveform 128, 130 in FIG. 6. The pulse so produced is actually a spectrum of frequency components, constituted of a large number of superposed sine waves of different frequencies, beginning at the commencement of the pulse. These frequencies are greatly in excess of the typical line frequency, 60 Hz. Depending on the conductivity of the triac 38 and the value of the capacitor 36, the spectrum or group of signals has frequencies typically up in the several Megahertz range, the higher groups of frequencies being fairly rapidly attenuated as their distance from the initial pulse source increases, as a consequence of filtering which occurs due to the inherent capacitance represented by the A. C. line cabling 22 (i.e. BX cable and the like).

Nevertheless, the broad spectrum of the signals contained in such a pulse travels along the line 22 being pulsed, and these signals can be detected on this line by suitable receivers at virtually any location on that line throughout a particular building, for example.

It is seen from the above that the transmitter 28 is active as distinguished from passive, because the passive load circuit portion by itself would not function. The passive load circuit 38, 36, 40, 42 functions only when activated by the actuating circuit comprising the Sidac 50, diode 48, resistor 46 and gate 44.

In accordance with the present invention there are provided novel and improved receivers for use in connection with the pulse-generating transmitter described above. One such receiver is shown in FIG. 2, employing a unique combination involving an inductive pick-up coil 54 having a magnetic core 56, in combination with a manually-adjustable bleed control means or resistive device 58, 60 that is connected to bridge the pick-up coil 54 and to bleed portions of the induced voltage therefrom so as to ultimately regulate or control the useful output or induced voltage obtainable from the coil.

Figure 2:
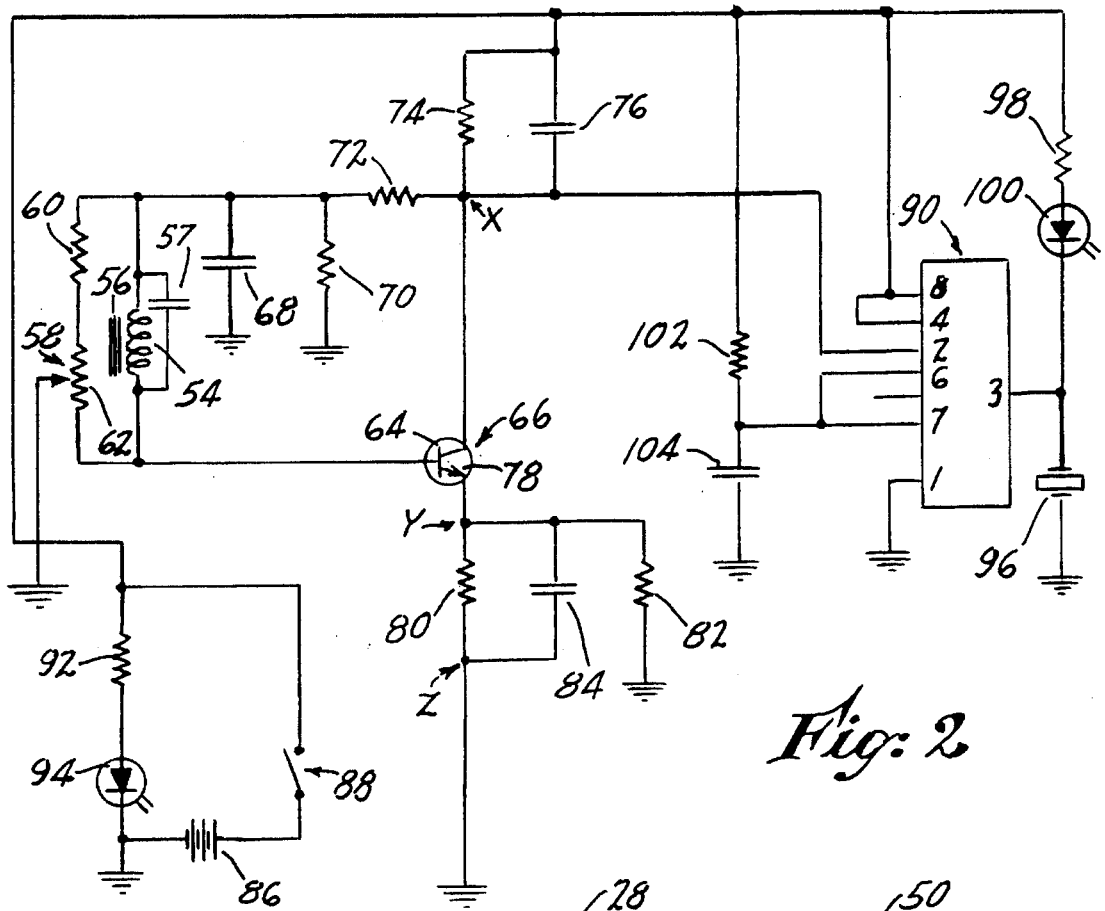
FIG. 2 is a schematic circuit diagram of a detecting circuit or receiver for use with the transmitter of FIG. 1, comprising a pick-up coil and a manually adjustable resistor which bleeds off induced voltages from the pick-up coil, so as to vary the output therefrom.

Specifically, in FIG. 2, the pick-up coil 54 having the magnetic core 56 is at its ends bridged by a resistive network circuit comprising the series-connected fixed resistor 60 and the resistive element 62 of the variable resistor device 58, and a resistor 70 which for a.c. purposes, parallels the resistor 60 and part of the resistor 62. One end of the coil 54 is connected by an input line (which constitutes an input terminal) to the base 64 of a transistor switch 66, and the other end of the coil 54 is connected to the fixed resistor 60, this junction in turn being connected by a by-pass capacitor 68 to ground which constitutes the other input or return line for the transistor 66. Resistor 70 and a resistor 72 are also biasing resistors for the transistor switch 66, whereas resistor 74 constitutes a load. A capacitor 76 provides stability against pick-up of stray signals.

The emitter 78 of the transistor switch 66 is connected for continuity of the signal path through resistors 80 and 82 to ground, these being bridged by a by-pass capacitor 84, which assists in achieving true switching operation of the transistor switch 66.

The indicated grounds can be considered as another part of the input or return line circuitry of the transistor switch 66. The transistor switch 66 is powered by a battery 86, and an on-off switch 88 selectively applies power to the transistor switch 66, and to a triggering integrated circuit timer module or device 90 to be described. An optional resistor 92 and LED 94 can be included as shown, to give a visual indication that the receiver is energized.

Output from the transistor switch 66 in the form of pulses is, in turn, fed to the trigger input terminal #2 of the triggering device 90, which is preferably arranged to operate in a monostable (timed one-shot) mode, with the ground completing the pulsing circuit for the triggering device 90. The output from the transistor switch 66 is a negative-going pulse when the voltage from the pick-up coil 54 is sufficient to operate the transistor switch 66. The timer module 90 can be a type "555" of known configuration per se. The timer module 90 is powered by the same battery 86 as the transistor switch 66. The output terminal #3 of the timer module 90 feeds an audible indicator 96, in this case a "piezo" buzzer. A resistor 98 and LED 100 are also connected to the output terminal #3, so as to provide a visual indication of the operation of the timer module 90; the arrangement is such that the buzzer and LED operate alternately. When power is applied to the receiver, with no signal being picked up by the pick-up coil the LED will become illuminated, since the output from the timer module 90 is low. When the output from the module 90 goes high, the piezo buzzer operates, and the LED becomes extinguished. A resistor 102 and capacitor 104, connected to terminals #6 and #7 of the timer module 90, are selected to provide a desired RC time constant for the monostable-connected timer, to correspond to timed "on" intervals that can be conveniently discerned by the user, typically one tone burst of the "piezo" buzzer per second.

The transistor 66 and triggering device 90 can be considered collectively as an electronic "trigger means" having an input line or terminal and a return or ground line or terminal, being so characterized in some of the appended claims. In operation, the transmitter 28 is first plugged into the receptacle 26 of the line 22 to be traced, as indicated in FIG. 3. The transmitter derives its power from this line 22, and also imparts to this line, a "spike" by virtue of the sudden application of the uncharged capacitor 36 of the transmitter as a momentary "short-circuit" load to this line. This pulse, as noted above, contains a broad spectrum of frequencies. The nature of the specific frequencies depends on the parameters of the triac 38 and capacitor 36, as well as to a lesser extent on the capacitance represented by the wiring to the panel. The pulse thus produced is detectable at the respective fuse 16 in FIG. 3 by selectively placing the pick-up coil 54 (which is preferably contained with the rest of the receiver circuitry in a single hand-held plastic casing) adjacent to the fuses 16, one at a time in succession, with the bleed resistor 58 of the receiver set at mid range.

If the amplitude of the pulses being received by the pickup coil 54 and bled by the resistor 58 is too low to operate the transistor switch 66, the resistor can be adjusted as necessary until the transistor 66 switches "on", in turn triggering a monostable cycle of the timer module 90 wherein "piezo" buzzer 96 sounds periodically, and the LED 100 becomes illuminated during the intervals between the sounding of the buzzer.

Movement of the pick-up coil 54 to others of the fuses 16 will result in either a repeated or successive operation of the timer module 90 in its monostable mode, or else a halting thereof. By proper manipulation of the pick-up coil 54 of the receiver, and adjustment of the bleed resistor 58 across the pick-up coil 54, it is possible to locate the particular fuse 16 corresponding to the line 22 carrying the receptacle 26 in which the transmitter 28 has been plugged. Thereafter, it is a simple matter to remove the fuse and thereby render the associated circuit 22 "dead", after which suitable connections, repairs, etc. can be made In consequence of the foregoing, the impedance network as shown can simultaneously variably bleed off or selectively, and in a controllable manner, reduce the useful voltage provided by the coil 54 (at its terminals) and at the same time bring the potential of the base 64 of the transistor 66 nearer to the ground potential of the system. It has been found by experimental tests that the particular arrangement which has been disclosed, namely the use of an adjustable bleeder resistor 58 bridging the pick-up coil 54, provides a high degree of control and resolution, particularly the ability to locate that one of the fuses 16 which is carrying the pulse produced by the transmitter 28. In addition, the lines leading to and from the respective fuse can be similarly traced out, as desired.

Such has not been the case with a number of the prior art devices employing variable sensitivity amplifiers and the like. With circuit locaters of this general type a certain amount of user interpretation or operator judgement is required in making the necessary readings. The device of the present invention has been found to be more user-friendly in this respect, than was the case with similar devices heretofore known.

Another embodiment of the invention is shown in FIG. 4, which illustrates a circuit that can be substituted for part of the circuitry of FIG. 2. In particular, in the circuit of FIG. 4, the components thereof connected to the terminals X, Y and Z are intended to be connected to the similarly designated terminals and substituted for the corresponding signal pick-up portion of the circuit of FIG. 2.

Referring to FIG. 4, wherein similar reference numerals but having the suffix "a" refer to corresponding components, there are shown modified connections between the pick-up coil 54a and a "bleed" resistor 58a. In this disclosed embodiment, the bleed resistor 58a is connected between the junction of one side of the pick-up coil 54a and the base 64a of the transistor switch 66a. The other "side" of the variable resistor 58a is grounded. By this arrangement, voltage induced in the pick-up coil 54a is, in part, by-passed to ground by an extent according to the setting of the resistor 58a. An especially smooth and repeatable control of the voltage feeding the transistor switch 66a is thereby made possible, with essentially complete freedom from problems with false or intermittent triggering of the transistor switch 66a. The operation of the transistor switch 66a and the remainder of the circuit involving the timer, "piezo" buzzer and LED is substantially the same as described in connection with the circuit of FIG. 2.

It will be readily understood that the voltage induced in the pick-up coil 54 or 54a is largely affected by the proximity of the coil to the fuse or power line being monitored. Slight hand movements which in turn move the receiver can result in difficulty in isolating the particular component; in arriving at the specific arrangement of pick-up coil 54 and bleed resistor 58 shown in FIG. 2, as well as that in FIG. 4, the inventor has discovered that in spite of slight movements of the user's hand, the receiver is especially easy to use, and reliable in locating the desired circuitry. Potential problems with false triggering and the like have not been experienced with the arrangements of the present invention.

Further, referring now to FIG. 5, and in accordance with the present invention there is provided a novel and improved universal-voltage transmitter 108 which is especially adapted for use with any or all 120 through 440 volt circuits, essentially with automatic compatibility built in.

In accomplishing the universal voltage compatibility, the transmitter or load means 108 incorporates a capacitor 110 as a load element, bridged by a resistor 112, providing a predetermined time constant. A Sidac 114 is in series with the paralleled resistor 112 and capacitor 110, and a diode 116 rectifies the incoming voltage, in the case that it is A. C. as opposed to D. C.

The time constant of the resistor 112 and capacitor 110, as well as the voltage rating of the Sidac, are selected such that for 120 volts A. C. operation, following an initial charging of the capacitor 110 through the conducting Sidac 114, mostly on a single given cycle of the A. C. wave, the Sidac 114 ceases conduction, and a number of subsequent alternating cycles are allowed to elapse as the capacitor is being discharged relatively more slowly through the resistor or impedance 112, and during which time the Sidac 114 remains non-conductive. The circuit of the transmitter 108 also has additional Sidacs 118 and 120 series-connected to resistors 122 and 124 respectively, the series strings being paralleled with the capacitor 110. Neither of the Sidacs 118 and 120 has conducted at all during this time, since their voltage ratings are both above the peak instantaneous rating of the 120 VAC input line voltage.

When the capacitor 110 discharges to the point where its voltage, when added to the voltage rating of the Sidac 114 approaches the maximum instantaneous voltage of the 120

VAC line, then the Sidac 114 resumes conduction for a portion of a cycle, instantaneously charging the capacitor 110 and thereafter becoming non-conductive for an additional number of cycles. The process repeats as long as the transmitter is plugged in.

By the invention, the additional Sidacs 118 and 120 provided in series with the additional resistors 122 and 124 respectively, have different and higher voltage threshholds. The values of the resistors 122 and 124 are so chosen that, with the application of the transmitter to a 220 volt line, both Sidac 114 and Sidac 118 conduct on a given cycle, after which Sidac 114 ceases to conduct but Sidac 118 continues to conduct, by virtue of its higher voltage rating, and the higher value of the charge on capacitor 110. This in turn presents resistor 122 as an additional "capacitor draining" current sink, paralleling the resistor 112. The effective time constant of the RC circuit involving the load capacitor 110 is thus changed (lowered), due to the addition of the resistor 122.

The value of resistor 122 is set so that the timing for 220 volt operation, as measured in numbers of cycles, between those cycles which result in the full charge of the capacitor 110, can be made either the same or nearly the same as for 120 VAC operation. This is considered an important feature, since with a 220 volt charge (peak instantaneous voltage of: 220×1.414=310 volts D.C.) applied to the capacitor 110, it would take a considerably longer time for the capacitor 110 to discharge through the single resistor 112, due to its initial starting point (310 volts D.C.). Thus the provision of the added Sidac 118 and resistor 122 result in a faster discharge of the capacitor 110, so that the Sidac 114 conducts at time intervals substantially the same as it did when the transmitter 108 was plugged into 120 VAC.

Also, by the invention, the third Sidac 120 in series with the resistor 124 enables a 440 volt system to be accommodated. The Sidac 120 has a voltage rating above that of Sidac 118, so that it conducts only when the transmitter is energized from 440 volts nominal (i. e. 620 volts instantaneous peak). In such case, all three Sidacs 114, 118 and 120 will conduct initially upon plugging in the transmitter to a 440 volt line, and Sidac 114 will, following the charging of load capacitor 110 over one cycle, cease to conduct. However, both Sidacs 118 and 120 will continue conducting until the voltage across the capacitor 110 drops sufficiently; during this time of simultaneous conduction, both resistors or impedances 122 and 124 are in parallel with the resistor or impedance 112, giving a still further reduced, third time constant to the capacitor discharge circuit. This reduced time constant can be tailored to compensate for the increased initial peak charge on the load capacitor as caused by the 440 volt connection.

In the case of D.C. supply lines with which the transmitter might be employed, the same type of operation would occur, i.e. selective conduction of the Sidacs to provide compensating (reduced) time constants with load capacitor 110 when the transmitter is employed with the higher D.C. voltages. Naturally, care would have to be exercised in order to insure that with D. C. voltages, the diode 116 of FIG. 5 was either omitted, or connected with the proper polarity to enable charging current to flow into the load capacitor so as to charge the capacitor 110 to an initial fixed D.C. level.

Typical values for the components of FIG. 5 are as follows: Diode 116 can be a type 1N4007; Sidac 114 can be a type K1300E, manufactured by Teccor Electronics, Inc. of Irving Tex. Capacitor 110 is typically a 0.47 uf. Resistor 112 is 270K ohms, as are resistors 122 and 124. Sidac 118 can be a type K2200F1, and Sidac 120 can be a type K3000F1, both manufactured by Teccor Electronics.

If desired, shunt capacitors 57 in FIG. 2 and 57a in FIG. 4 can be connected respectively across the terminals of the pickup coils 54 and 54a, thereby forming resonant circuits therewith. The values of the capacitors 57, 57a can be chosen so that the resonant frequency of such circuits can closely approximate the frequency of the ripple voltage 130 shown in FIG. 6. The ripple voltage 130 is produced by the momentary short-circuit on the line 22 produced by the capacitor 36 of the transmitter 28, and typically is characterized by a primary sine-wave like frequency component having a period T, in FIG. 6. The reciprocal of T, i.e. 1/T, is the frequency of the primary frequency component. By actual measurement, with a capacitor 36 having a value of from 0.47 uF. to about 2 uF, the period T is typically between 10 and 20 usec., corresponding to a frequency of 100 kHz. to 50 kHz. This arrangement of shunt capacitors 57 in FIG. 2 and 57a in FIG. 4, and pick-up coils 54, 54a, respectively, results in sharply-tuned LC circuits each having a resonant frequency as determined by the waveform of the sine-like wave having a period T, as initiated by the transmitter 28. The taking off of the energy or voltage of such resonant circuits is effected by the connections to the terminals of the pick-up coils, as will be understood. Also, regardless of other circuitry, the resonant frequency of the LC circuits just mentioned is determined essentially by the inductive and capacitance values. A typical value of such an inductive circuit can be on the order of 2.4 mH, for the coil 54, and 0.0005 uF. for the capacitor 57. Assuming that the coil's d.c. resistance is typically between 10 and 15 ohms, a "Q" or quality factor of the LC circuit in the neighborhood of 500 or so can be attained, at a frequency of 100 kHz., for example, the "Q" figure of 500 representing a very highly selective, sharply tuned resonant circuit.

Figure 7:
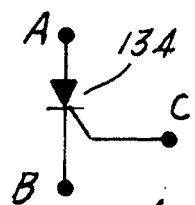
FIG. 7 is a schematic circuit diagram intended for substitution in the circuit of FIG. 1, at the terminals labelled "A", "B", and "C"

Another embodiment of the invention is illustrated in FIG. 7, comprising a component for a transmitter which is in some respects similar to the transmitter of FIG. 1. FIG. 7 shows an SCR 134 connected between terminals "A" and "B" and having its gate connected to terminal "C". The circuit of FIG. 7 is intended to replace the similarly designated portion of the circuit of FIG. 1 that is connected to the terminals of the triac 38, namely the terminals "A", "B" and "C". The functioning of the transmitter is essentially the same as that already described for the original circuit of FIG. 1.

Figure 8:
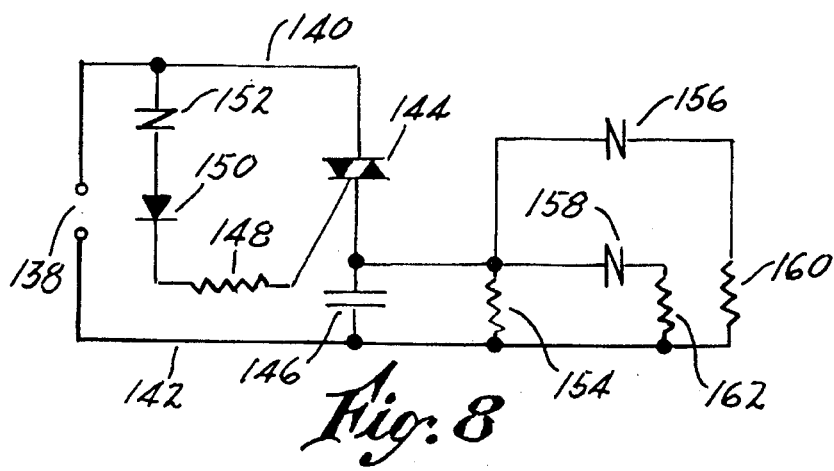
FIG. 8 is a schematic circuit diagram of a transmitter comprising another embodiment of the invention.

Yet another embodiment of the invention, comprising a universal transmitter which can be used in place of the transmitter of FIG. 5, is shown in FIG. 8. In this figure, power input terminals 138 are connected to a load circuit comprising leads 140 and 142 and a triac 144 and load capacitor 146. The gate of the triac 144 is connected by a resistor 148, diode 150 and Sidac 152 to the lead 140. Across the load capacitor 146 is a resistor 154, which has in parallel with it two series circuits comprising Sidacs 156 and 158 joined to resistors 160 and 162 respectively. Operation is similar to that of FIG. 5 discussed above. Any voltage between 120 and 440 volts can be connected across the terminals 138. The time constant of the RC circuit comprising capacitor 146 and resistor 154 automatically adapts to a higher voltage, for example 220 volts, by virtue of the conduction of Sidac 158 which introduces resistor 162 across resistor 154. For 440 volts, conduction of Sidac 156 occurs, which introduces resistor 160 across or in parallel with resistors 154 and 162 simultaneously.

As an alternative to the circuit of FIG. 8, a similar configuration can be employed wherein Sidac 156 and resistor 160 are omitted, and the resultant circuit comprising triac 144, capacitor 146, resistor 148, diode 150, Sidac 152, resistor 154, Sidac 158 and resistor 162 utilized, for a universal operation between 120/220 volts on the one hand, and 440 volts on the other hand. Under such circumstance, the Sidac 158 is arranged to have a conduction threshhold between 220 and 440 volts, such that resistor 162 will be introduced across resistor 154 only at voltages above 220 volts nominal, but below 440 volts nominal.

From the above it can be seen that I have provided novel and improved circuit locaters which are both simple in their structure and reliable in use. The novel "bleeder resistor" arrangement for the pick-up coil has been found to provide excellent results from the standpoint of ease of use, and freedom from inadvertent triggering. The effects of slight movements in the hand of the user holding the receiver and pick-up coil contained therein are not objectionable.

In addition, the universal transmitters that have been described are especially simple in their structure. The circuits are fully automatic in operation, compensating for variations that would otherwise exist when switching between any of 120–440 VAC or D.C. line tests.

The disclosed devices are thus seen to represent distinct advances and improvements in the filed of circuit locaters.

Variations and modifications are possible without departing from the spirit of the invention.

Each and every one of the appended claims defines an aspect of the invention which is separate and distinct from all others, and accordingly it is intended that each claim be treated in this manner when examined in the light of the prior art devices in any determination of novelty or validity.

What is claimed is:

1. A hand-held electronic means for inductively detecting low frequency pulses of high magnitude and short duration in an electrical circuit, comprising in combination:
    a) an inductive pick-up coil and a magnetic core therefor, said pick-up coil having two terminals,
    b) electrical signalling means,
    c) an electrical power source for electrically energizing said signalling means,
    d) an electronic trigger means responsive to voltage induced in said pick-up coil for effecting energization of the signalling means from said power source, said trigger means having a ground terminal at electrical ground potential and an input terminal responsive to drive voltages applied to it, and
    e) a control means connected to the terminals of said pick-up coil, said control means comprising a manually-adjustable variable value resistive device which connects to and bridges the terminals of said pick-up coil, said resistive device adjustably reducing the value of the useful voltage across said pick-up coil terminals as the value of said resistive device is manually reduced, and simultaneously pulling down the voltage on the input terminal of said trigger means with respect to the ground potential of the said ground terminal all in response to the reduction in the value of said resistive device.

2. The invention as set forth in claim 1, wherein:
    a) said control means includes a capacitor connected across solely a portion of said resistive device.

3. The invention as set forth in claim 1, wherein:
    a) said control means comprises a capacitor connected in series with a portion of said resistive device to form a series string which is connected across the pick-up coil terminals.

4. The invention as set forth in claim 1, wherein portions of the induced voltage in the pick-up coil are bled off to said ground terminal.

5. The invention as set forth in claim 1, wherein portions of the induced voltage in the pick-up coil are shunted to said ground terminal.

6. The invention as set forth in claim 1, wherein a capacitor is provided, connected in parallel with the pick-up coil to form therewith a resonant circuit.

7. The invention as set forth in claim 6, and further including a transmitter for producing said high-magnitude pulses, and wherein said pulses are characterized by a primary frequency component, said resonant circuit being tuned substantially to the frequency of said primary frequency component.

8. The invention as set forth in claim 1, wherein:
    a) one terminal of said pick-up coil is directly connected to said input terminal of the trigger means, and the other terminal of said pick-up coil is connected through a by-pass capacitor to said ground terminal, so as to facilitate passage of current from said pick-up coil into said input terminal of said electronic trigger means.

\* \* \* \* \*